United States Patent [19]
Baechtle

[11] Patent Number: 5,137,454
[45] Date of Patent: Aug. 11, 1992

[54] SURFACE-MOUNT SOLDER-TAIL TERMINAL MEMBER

[75] Inventor: David R. Baechtle, Enola, Pa.
[73] Assignee: AMP Incorporated, Harrisburg, Pa.
[21] Appl. No.: 709,007
[22] Filed: May 31, 1991
[51] Int. Cl.$^5$ ............................................. H01R 9/09
[52] U.S. Cl. ...................................... 439/62; 439/83; 439/267; 439/637; 439/78
[58] Field of Search ................. 439/59, 62, 76, 78, 439/82, 83, 267, 636, 637

[56] References Cited

U.S. PATENT DOCUMENTS

| | | | |
|---|---|---|---|
| 3,475,657 | 10/1969 | Knowles | 439/62 |
| 4,682,829 | 7/1987 | Kunkle et al. | 439/83 |
| 4,828,503 | 5/1989 | Gilissen et al. | 439/62 |
| 4,895,521 | 1/1990 | Grabbe | 439/78 |
| 4,898,539 | 2/1990 | Glover et al. | 439/81 |
| 4,978,308 | 12/1990 | Kaufman | 439/83 |

FOREIGN PATENT DOCUMENTS 2237690  5/1991  United Kingdom .................. 439/82

Primary Examiner—Paula A. Bradley
Attorney, Agent, or Firm—Katherine A. Nelson

[57] ABSTRACT

Surface-mount solder-tails (124) for use in a surface-mount edge connector (100) and other surface-mount components. The terminal members (120) are each formed with an upper-section providing a bearing surface to facilitate slidable insertion of a circuit board within connector housing (10), a mid-section which serves to anchor terminal members (120) within housing (10), and an improved solder-tail section (124) of compact design for establishing electrical contact with conductive traces on the surface of a motherboard (30). The improved solder-tails (124) are provided with an elbow to increase the length, thereby increasing the resiliency in the vertical and horizontal directions. Alternatively, solder-tails (124) may be narrowed or annealed to achieve the same result. Edge connector (100) minimizes an aggregate normal force imparted to said second circuit board (30) while maintaining a proper electrical connection, and the solder-joints are well-protected from stresses imparted to the motherboard.

2 Claims, 5 Drawing Sheets

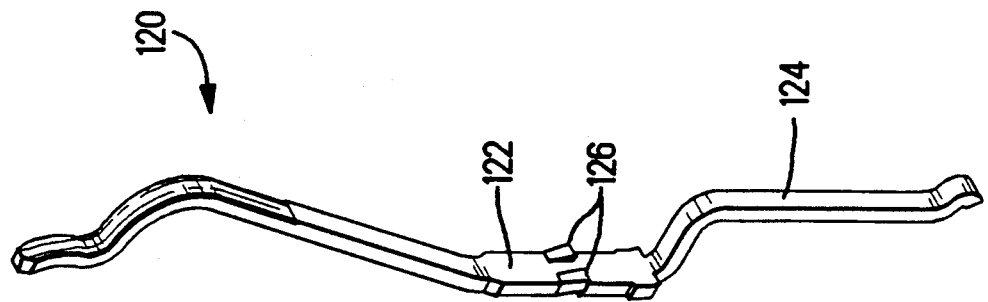
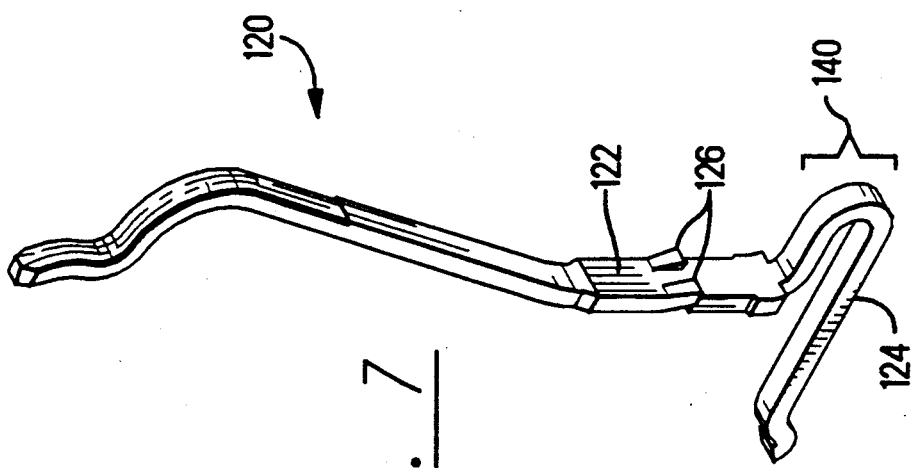

SURFACE-MOUNT SOLDER-TAIL TERMINAL MEMBER

CROSS-REFERENCE TO RELATED APPLICATIONS

This application is related to co-pending application, Ser. No. 07/709,038 now U.S. Pat. No. 5,108,308, entitled "PYLON ACTUATED LOCKING EYELET", filed concurrently herewith.

FIELD OF THE INVENTION

The invention relates to electrical terminals of the surface-mount type which mount directly on the surface of a motherboard and, in particular, to improved solder-tail terminal members of the type used in surface-mount electrical connectors. The terminal members have improved compliancy for reducing the insertion force necessary to mount the connector on a motherboard, and for protecting the solder joints from the various stresses which may be incurred.

BACKGROUND OF THE INVENTION

Surface-mount technology has several distinct advantages which are helping to foster a growing acceptance in the industry. Surface-mount components are mounted and soldered directly to a surface of a circuit board. It is unnecessary for the component terminals to penetrate the circuit board as in conventional mounting technology. This feature is especially useful in the context of electrical connectors.

The terminal members of surface-mount connectors may be soldered directly to the appropriate traces on the surface of the circuit board. In contrast, conventional connectors require drilling of multitudinous holes through the motherboard to accommodate the terminal members, each of which penetrates the motherboard and is soldered to the underside.

In eliminating the pre-drilled holes, surface-mount technology conserves board space and permits a greater trace density on each layer of the motherboard. Consequently, fewer layers are necessary. Moreover, surface-mount connectors occupy a single side of a motherboard, and there are no associated solder connections on the underside. This frees even more space because the underside is available for mounting of additional components. In addition to the economies of space, surface-mount connectors simplify the manufacturing process with fewer machining operations, relaxed tolerances, and a lower insertion force necessary for installation. In sum, considerable cost savings are made available through surface-mount technology.

Unfortunately, there have been problems encountered in the implementation of the technology. As described, conventional mounting technology incorporates terminal members which penetrate the motherboard and are soldered to the underside. These terminals inherently align the connector, and retain the connector on the motherboard during the soldering operation. Once soldered, the terminals provide an extremely strong anchor which protects the solder-joints. Surface-mount terminal members lack these inherent advantages. As a result, surface-mount connectors are commonly outfitted with one or more mounting pylons which are inserted through the motherboard to align the connector and hold it in place during the soldering operation. Once soldered, the mounting pylon(s) absorb stresses imparted to the motherboard, thereby protecting the solder-joints.

One widely used variety of surface-mount connector is the edge connector 2 shown in FIG. 1. Housing 10 of edge connector 2 is provided with a receptacle 12 adapted for receiving an edge of a daughterboard (not shown). The connector 2 is mounted directly on the surface of a motherboard 30. To help align the connector, and to retain the connector 2 during the soldering operation, connector 2 is preferably mounted on at least one support pylon 4 which extends from the bottom of the connector housing 10 at spaced intervals along the length. Support pylon 4 is locked within predrilled holes in the motherboard 30. A preferred example of a locking anchor for a support pylon can be found in related application Ser. No. 07/709,038, entitled "PYLON-ACTUATED LOCKING-EYELET", filed concurrently herewith.

Numerous electrical terminal members 20 are arranged in rows within connector housing 10 on facing sides of receptacle 12. As shown in FIG. 2, terminal members 20 are arranged in pairs of opposing terminal members. When the edge of a daughterboard is inserted within connector receptacle 12, the daughterboard is firmly retained between an opposing pair of terminal members 20.

Each terminal member 20 includes a section 24 which extends through the bottom of connector housing 10 to the surface of the motherboard 30 on which the connector is mounted. The resiliency of terminal member 20 biases it against both motherboard and daughterboard to insure a proper electrical connection therebetween.

The section of the terminal members 24 which protrudes from beneath the connector housing is known as a solder-tail. After connector 2 has been mounted on the motherboard 30, the solder-tails 24 may be conveniently soldered to adjoining traces on the surface of motherboard 30.

As shown in FIG. 2, prior art solder-tails 24 extend downward from connector housing 10 to a right-angle bend 26, at which point solder-tails 24 extend parallely across the bottom surface of connector housing 10. Hence, prior art solder-tails 24 are generally L-shaped in appearance. The L-shaped solder-tails 24 provide a minimal amount of resiliency to accommodate variations across the surface of the motherboard 30. A certain level of resiliency is necessary to insure that the numerous solder-tails 24 extending across the connector all make proper contact with motherboard 30.

However, it has been found that the resiliency of the L-shaped solder-tail of FIG. 2 is insufficient in many instances, and cannot accommodate variations in the surface of the motherboard 30. When the connector 2 is properly mounted on the motherboard 30 via support pylons 4, the resilient solder-tails 24 themselves exert a sufficient opposing normal force to contort the motherboard 30. The high normal force imparted to the motherboard 30 by a conventional surface mount solder-tail 24 will vary in accordance with the deflection of each solder-tail 24. As shown in FIG. 3 by broken line B, when the deflection of a 0.0125-inch wide by 0.0125-inch thick solder-tail 24 is approximately $1.25 \times 10^{-3}$ inches, the solder-tail 24 imparts a normal force of approximately 18 grams to the surface of the motherboard 30. Therefore, the solder-tail 24 has a spring rate of approximately 14.6 grams per mil. If each terminal member of a 188-pin connector is deflected 0.004 inches, an aggregate normal force of approximately 24.2 pounds would be imparted to the surface of motherboard 30. A 0.0160-inch wide by 0.0125-inch thick solder-tail 24 would, under the above-described conditions, impart an aggregate force of approximately 30.2 pounds to motherboard 30, as shown in FIG. 3 by the solid line A.

The aggregate force imparted to the motherboard 30 may result in substantial deformation of the surface of motherboard 30, especially in the region lying between adjacent support pylons 4. For example, as shown in FIG. 4, the portion of the motherboard located midway between adjacent support pylons 4 will be distorted by an amount equal to $\Delta y$, where $\Delta y$ may exceed 1 mm.

The L-shaped solder-tails 24, which themselves may partially or wholly cause non-uniformity, are unable to provide the necessary resiliency to accommodate the non-uniformity. Hence, it is likely that some solder-tails 24 will fail to make proper contact with motherboard 30. The improper contact will result in a cold or otherwise deficient solder joint when solder is later applied during the manufacturing operation.

Moreover, once the connector is mounted and soldered to the motherboard, external stresses are inevitably imparted. For example, when assembling motherboard 30 in a system, motherboard 30 may be twisted or otherwise contorted. In addition, the temperature conditions found within many electronic systems may induce temperature-related warping of the motherboard 30. Such conditions may alone or in combination cause various non-uniformities across the surface of motherboard 30, and may stress the solder-joints. Furthermore, the mating and unmating of the daughter card from the connector also puts stress on the solder joints. Conventional L-shaped solder-tails fail to provide the necessary resiliency to accommodate major variations. In addition, external stresses may break the solder-joints or solder-tails unless there is resiliency in two-directions. After mounting the connector to the board, the L-shaped solder-tails are capable only of compliancy in the vertical direction. This one-directional compliancy is insufficient to protect against stresses in the horizontal direction of the connector.

The above-described weakness of conventional surface-mount solder-tails, and the consequent risk of breakage of the terminal member or solder joint presents a reliability problem to the user, which translates into quality-assurance problems and high warranty costs for the manufacturer.

Clearly, it would be greatly advantageous to improve the compliancy of each surface-mount solder-tail to improve contact and lower the force required to mount the connector to the board, and to add compliancy in the horizontal-direction to improve the protection of the solder-joints.

SUMMARY OF THE INVENTION

It is therefore an object of the present invention to provide a more resilient surface-mount solder-tail terminal member with increased conformity to the non-uniform surface of a circuit board.

It is another object of the present invention to provide a resilient surface-mount solder-tail terminal member with compliancy in both vertical and horizontal directions to accommodate all types of stresses and non-uniformities in the surface of a circuit board.

It is another object of the present invention to provide an improved solder-tail terminal member for a surface-mount connector which minimizes the force necessary to mount the connector on a motherboard and, once mounted, minimizes the force absorbed by the circuit board.

It is a further object of the present invention to provide the above-described advantages with a compact solder-tail terminal member having an increased overall length (for increased resiliency), and which fits within a conventional connector housing, thereby occupying no additional space on the circuit board.

According to the present invention, these and other objects are accomplished by providing a terminal for an electrical component incorporating an improved surface-mount solder-tail. The terminal comprises an elongate strip of conductive material formed with a solder-tail having an elbow for increasing a compliancy of said solder-tail. An area of reduced width, thickness, or an annealed area may be provided as an alternative or in combination with the elbow.

Further, an improved terminal member for a surface-mount connector is disclosed. Each terminal member comprises an elongate strip of conductive material formed with a first section for electrically contacting a daughterboard, a mid-section for anchoring the terminal member within a connector housing, and a solder-tail for electrically contacting a motherboard. The solder-tail includes means for increasing its resiliency with respect to the mid-section to provide more compliant contact with the motherboard, thereby affording more protection to the solder-joints by minimizing stress thereto. The means for increasing the resiliency is preferably a elbow formed along the solder-tail, but alternatively may be an area of reduced thickness or width, or an annealed area along the solder-tail.

BRIEF DESCRIPTION OF THE DRAWINGS

Other objects, features and advantages of the present invention will become more apparent from the following detailed description of preferred embodiments and certain modifications thereof when taken together with the accompanying drawings, in which:

FIG. 6 is a perspective view of a terminal member 20 as it appears prior to insertion within connector housing 10.

FIG. 7 is a perspective view of a terminal member 20 as further formed after insertion within housing 10.

DETAILED DESCRIPTION OF THE PREFERRED EMBODIMENTS

A card edge connector is being used for purposes of illustrating the invention. It is to be understood that the surface mount terminal can be used in other types of connectors as well, such as for example pin and socket connectors.

Figure 5:
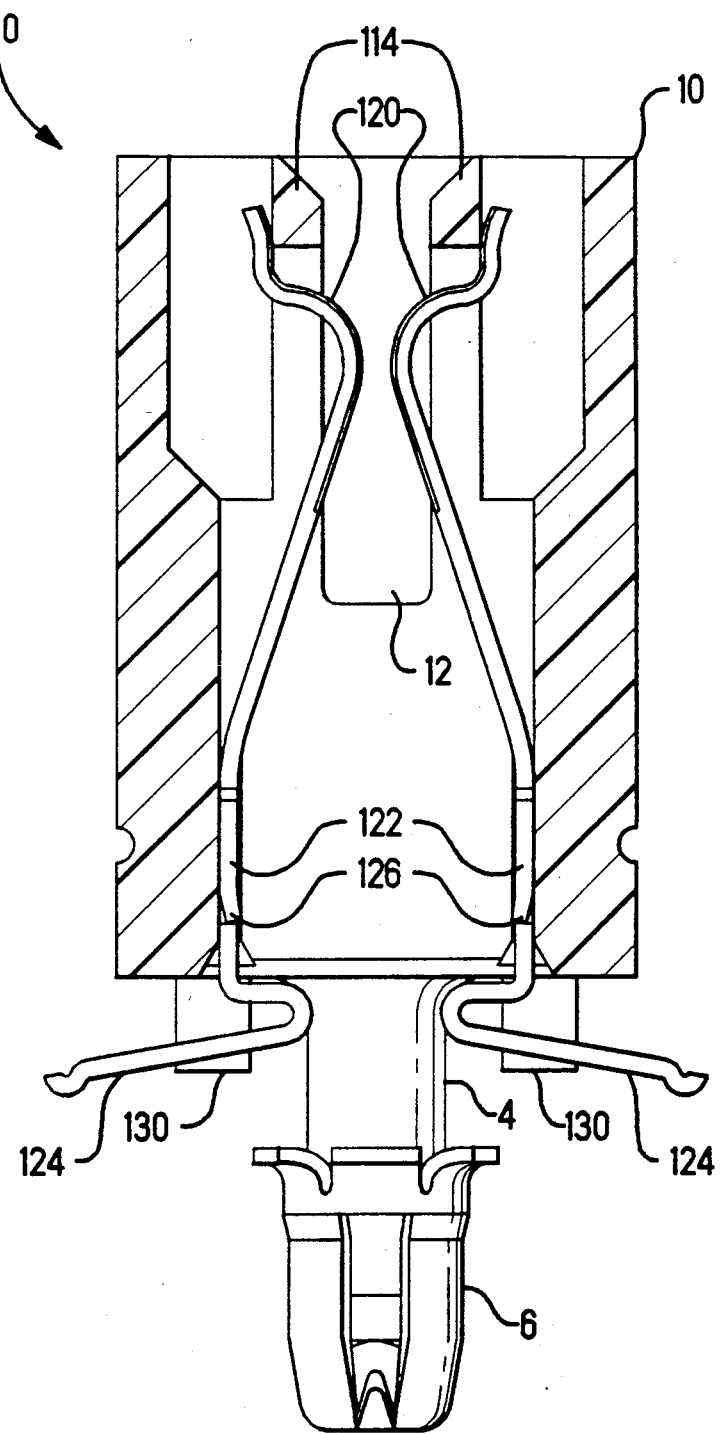
FIG. 5 is a cross-section of a surface-mount edge connector incorporating surface-mount solder-tail terminal members according to a preferred embodiment of the present invention.

FIG. 5 is a cross-section of a surface-mount edge connector 100 incorporating surface-mount solder-tail terminal members 120 according to a preferred embodiment of the present invention.

Connector housing 10 is formed with a receptacle 12 at the upper end for edge-wise insertion of a daughterboard. A pair of terminal members 120 are carried within housing 10 on opposing sides of receptacle 12. Terminal members 120 are formed with an upper-section which is configured to provide a bearing surface to facilitate slidable insertion of the daughterboard within receptacle 12.

The upper-section of terminal members 120 is integral with a mid-section which serves to secure terminal member 120 within housing 10. Each terminal member 120 is provided with a footer 122 at the mid-section for anchoring the terminal member 20 within the connector housing 10. Preferably, footer 122 comprises a short length of the terminal member 120 mid-section having an enlarged width. Footer 122 may be punched inward along its length to form one or more overhanging tabs 126 with sharp edges for gripping the sides of connector housing 10. Terminal members 120 are angled at the mid-section and are inclined towards each other and to the center of connector housing 10. Connector housing 10 is provided with a pair of opposing stops 114 which flank receptacle 12. Stops 114 have sloping faces to guide insertion of the daughter card into receptacle 12. The upper-ends of terminal members 120 are formed with slight hooks which catch stops 114.

Both terminal members 120 are also provided with solder-tails 124 protruding from beneath the connector housing 10. It is the solder-tails 124 which establish electrical contact with conductive traces on the surface of the motherboard. Preferably, terminal member 120 is formed from a flat pre-cut strip of conductive material such as copper, copper alloy, or other suitable material as known in the art. The upper-section and mid-section of terminal members 120 are configured in the proper shape, as shown in FIG. 5, before insertion of the terminal members within connector housing 10. However, the solder-tail 124 is left unformed. The terminal members 120 are inserted inside housing 10 until the mid-section is anchored at the bottom of housing 10. The upper-sections of terminal members 120 are biased inward toward the center of receptacle 12 until caught by the hooks on stops 114. The spacing of stops 114 maintains a slight clearance between the opposing terminal members 120. On one hand the clearance is sufficient to protect against a short circuit, and on the other hand the clearance is smaller than the thickness of the daughterboard inserted within receptacle 12 so that the circuit board is pressed between terminal members 120. Terminal members 120 are preferably biased against stops 114 to increase the normal force. In addition, a circuit board that is fully inserted in receptacle 12 will be firmly retained therein by terminal members 120. Thus, a stable electrical connection will be established.

Once terminal members 120 are seated within housing 10 and solder-tails 124 protrude straight downward from beneath housing 10, the solder-tails 124 can be formed in accordance with the preferred embodiment of the invention.

In the preferred embodiment, each solder-tail 124 is bent inward at a right angle toward the center of housing 10, the bend occurring at a point immediately beneath housing 10. Hence, each solder-tail 124 extends a short distance along the bottom of housing 10 towards the center of connector 100. Solder-tail 124 is then bowed outward from connector 100 to extend laterally outward at a slight downward incline. The elbow 140 lengthens the solder-tail 124, thereby increasing its resiliency. However, elbow 140 is compact, and may be contained within the same boundaries as prior art solder-tails. Hence, solder-tail 124 increases the resiliency and fits completely within the existing deadspace beneath connector housing 10. No additional board space is required.

FIG. 6 illustrates a perspective view of a solder-tail 124 as it appears prior to insertion within connector housing 10. Solder-tail 124 extends straight downward. Footer 122 is punched inward along its length to form two overhanging tabs 126 with sharp edges for gripping the sides of connector housing 10.

FIG. 7 illustrates a perspective view of a solder-tail 124 as it would appear when elbow 140 is formed after insertion within housing 10.

Once connector 100 is fully assembled and elbow 140 is formed, connector 100 can be mounted on a motherboard. The mounting operation will now be described with reference to FIG. 5. As shown, an eyelet 6 is mounted at the tip of each support pylon 4. Preferably, the eyelet to be used is such as disclosed and claimed in related co-pending application Ser. No. 07/709,038, entitled "PYLON ACTUATED LOCKING EYELET", the subject matter of which is herein incorporated by reference.

Each pylon 4 with eyelet 6 is then inserted within a respective pre-drilled hole in the motherboard. As an insertion force is applied to the connector, eyelet 6 becomes anchored within the hole, and pylon 4 becomes locked within the eyelet 6. Spacers 130 are formed integrally on the lower surface of housing 10 to maintain a predetermined clearance between housing 10 and the motherboard.

Once inserted, the solder-tails 124 will bear against the surface of the motherboard. Preferably, exposed contact pads are provided at the surface of the motherboard for improved connection with the corresponding solder-tails 124.

Due to the elbow in the solder-tails 124 of each terminal member 120, the solder-tails 124 have a higher degree of resiliency and impart a low normal force to the motherboard. Hence, there is a far greater compliancy of solder-tails 124 across the surface of the motherboard 30, and a lower aggregate normal force is imparted to the motherboard by connector 100. Moreover, the solder-tails 124 are compliant in both the vertical and horizontal directions, and are better able to protect and minimize the solder-joints because they accommodate all types of non-uniformities.

Figure 4:
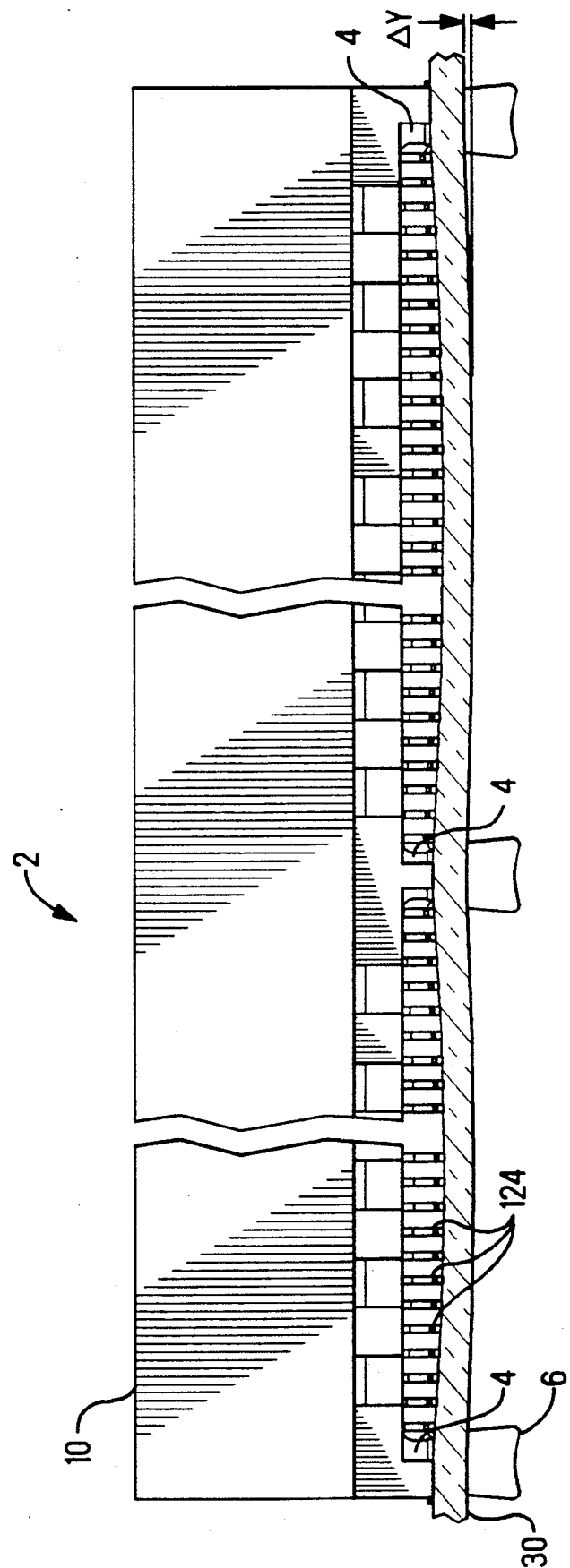
FIG. 4 is a perspective view of a surface-mount edge connector illustrating the degree of distortion which prior-art solder-tails may impose on a circuit board.

The improved compliancy allows terminal members 120 to accommodate larger $\Delta y$ variations in the surface of the circuit board, as shown in FIG. 4. Moreover, the terminal members 120 are less inclined to cause such variations.

Figure 1:
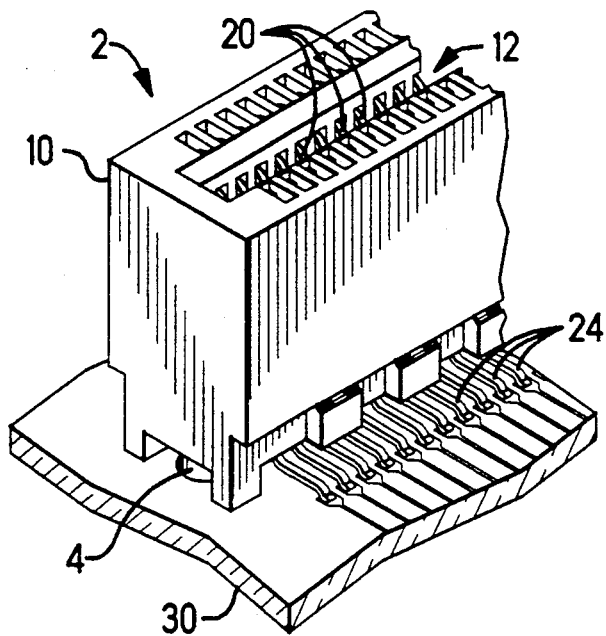
FIG. 1 is a prior art illustration of a surface-mount edge connector.
Figure 2:
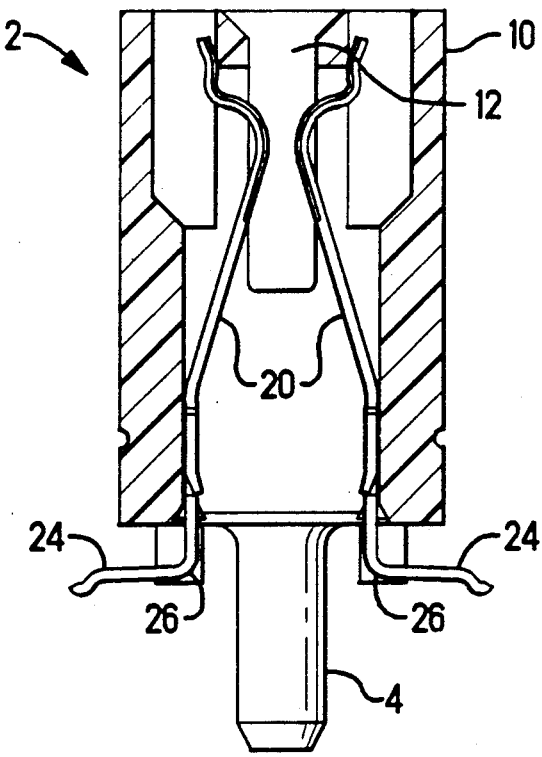
FIG. 2 is a cross-sectional diagram of a prior art solder-tail of the type most commonly used in the connector of FIG. 1.
Figure 3:
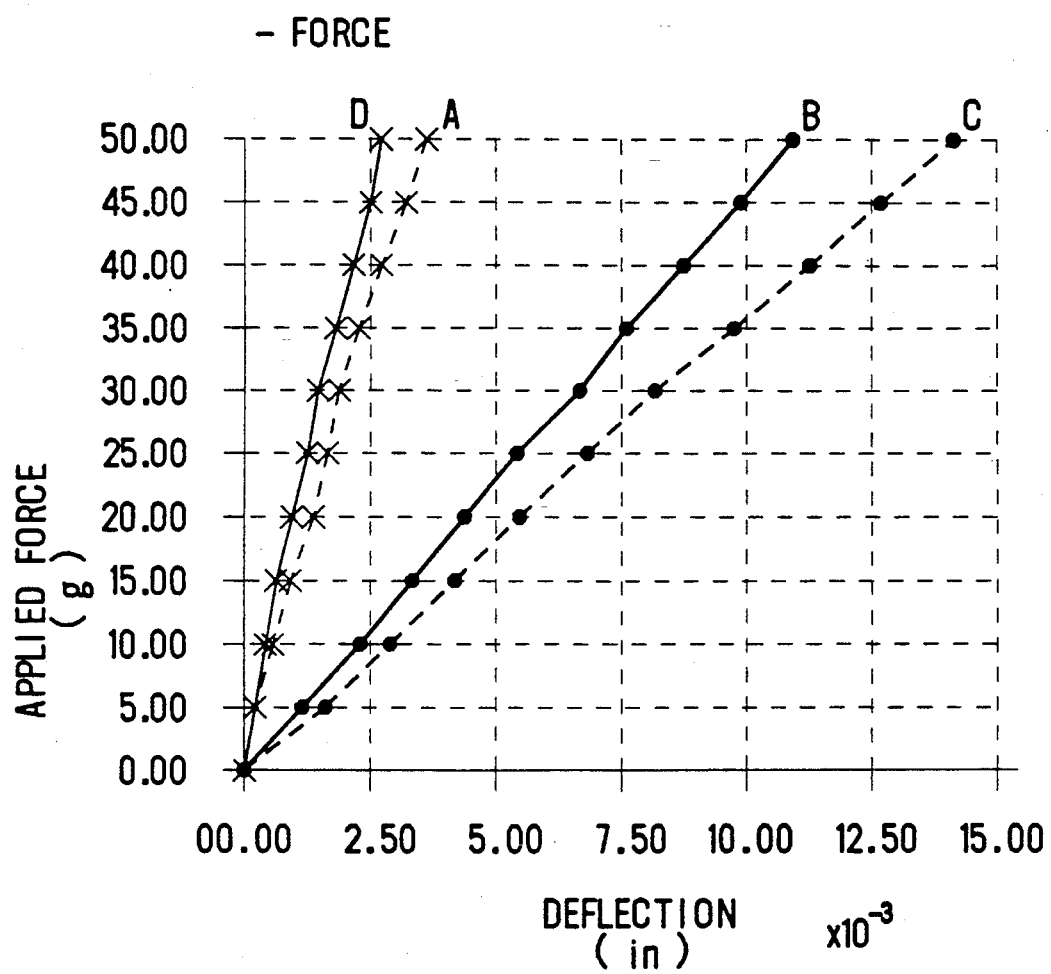
FIG. 3 is a graphical illustration of the normal force (in grams) imparted to a circuit board by various solder-tail terminal members A-D as a function of the deflection of the solder-tail.

Referring back to FIG. 3, solid line C represents the normal force applied to the motherboard as a function of deflection, for the terminal members 120 of the present invention. As shown, the applied force is approximately 5.6 grams when the 0.0160-inch wide by 0.0125-inch thick solder-tail 124 is deflected by a distance of $1.25 \times 10^{-3}$ inches Thus, the solder-tail 124 has a spring rate of approximately 4.5 grams per mil. For example, if each of the terminal members of a 188-pin connector are deflected 0.004 inches, the result is approximately 7.5 pounds of aggregate force imparted to motherboard 30. When compared to a prior art solder-tail 24 of the same cross-section, line A, the improved solder-tails 124 of the present invention apply only ¼ of the force.

Although the above descriptions set forth a preferred embodiment of the present invention, other embodiments may be employed to accomplish the same objectives. For example, the width of solder-tail section 124 may be reduced at the point where solder-lead section 124 protrudes from below the connector housing 10. The reduced width also helps to increase the compliancy. However, unlike the preferred embodiment, this embodiment results in a more fragile terminal member 120.

Similarly, the thickness of terminal member 120 may be reduced with the same consequent advantages and disadvantages. These different dimensions may be accomplished by skiving, milling, coining, or notching the solder lead along its length.

In still another embodiment, terminal member 120 may be annealed along the portion of solder-tail section 124 protruding from beneath the connector 100. This also increases the compliancy, but results in a more fragile terminal member 120.

The features of the above-described embodiments may be incorporated singly or in combination. For example, FIG. 3, line D, illustrates the surface-mount lead normal force as a function of deflection for the terminal member of FIG. 5 with the additional feature that the width of the terminal member 120 has been reduced to 0.012 inches at a point where the solder lead section 124 projects from below the connector 100. As shown, surface mount lead normal force is further reduced by about 20% as a result of combining the reduced width.

Although the terminal members are clearly useful in surface-mount connectors, they may be used to mount any electrical component to the surface of a circuit board.

Having now fully set forth the preferred embodiments and certain modifications of the concept underlying the present invention, various other embodiments as well as certain variations and modifications of the embodiment herein shown and described will obviously occur to those skilled in the art upon becoming familiar with said underlying concept. It is to be understood, therefore, that within the scope of the appended claims, the invention may be practiced otherwise than as specifically set forth herein.

I claim:

1. A connector assembly, comprising:
   a connector housing having a mating face adapted for mating with an electrical article and a mounting face adapted for mounting to a circuit board;
   support means for mounting said connector housing on a motherboard;
   a plurality of surface-mount solder tail terminal members arranged within said connector housing for completing an electrical connection between said electrical article and corresponding circuits of said circuit board, each surface-mount solder-tail terminal member further comprising an elongate conductive strip formed with an upper-section for electrically contacting a corresponding conductive member of said electrical article, a mid-section for anchoring said surface-mount solder-tail terminal member within said connector housing, and a solder-tail for electrically contacting said circuit board, said solder-tail further comprising means for increasing a resiliency of said solder-tail to provide compliant with said circuit board,
   said resiliency increasing means including an elbow formed in said solder-tail for increasing said resiliency by increasing an effective length of said solder-tail for accommodating non-uniform mounting surfaces, said solder-tail being contiguous with and extending laterally from said mid-section, bowing around at said elbow, and protruding transversely beneath said mid-section and beyond said connector housing and configured to define a bearing contact with a contact pad on said motherboard, spaced outwardly from said housing, wherein upon mounting said connector to said circuit board and soldering said solder-tails to conductive pads on said board, said resilient terminals minimize stress on said soldered connections due to said nonuniformities of said mounting surfaces.

2. The connector assembly of claim 1 wherein said resiliency increasing means further includes a section along said solder-tail having a reduced width.

* * * * *